United States Patent
Chuang et al.

(10) Patent No.: US 11,688,624 B2
(45) Date of Patent: Jun. 27, 2023

(54) METHOD FOR FORMING A SHALLOW TRENCH ISOLATION STRUCTURE WITH REDUCED ENCROACHMENT OF ACTIVE REGIONS AND A SEMICONDUCTOR STRUCTURE THEREFROM

(71) Applicant: Nanya Technology Corporation, New Taipei (TW)

(72) Inventors: Da-Zen Chuang, Taipei (TW); Chih-Chung Sun, Hsinchu County (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 17/411,577

(22) Filed: Aug. 25, 2021

(65) Prior Publication Data
US 2023/0060410 A1  Mar. 2, 2023

(51) Int. Cl.
*H01L 21/762* (2006.01)
*H01L 27/10* (2006.01)
*H01L 21/3105* (2006.01)

(52) U.S. Cl.
CPC .. *H01L 21/76224* (2013.01); *H01L 21/31053* (2013.01); *H01L 27/10* (2013.01)

(58) Field of Classification Search
CPC ......... H01L 21/76224; H01L 21/31053; H01L 27/10; H01L 21/76229; H01L 27/1052
USPC ............................................ 438/207; 257/506
See application file for complete search history.

(56) References Cited

U.S. PATENT DOCUMENTS

| 2005/0079722 A1* | 4/2005 | Yu .......................... H01L 21/302 438/706 |
| 2006/0046426 A1* | 3/2006 | Sandhu et al. .... H01L 127/1052 438/424 |
| 2006/0223279 A1* | 10/2006 | Patraw et al. .... H01L 21/76229 438/427 |

* cited by examiner

*Primary Examiner* — Thinh T Nguyen
(74) *Attorney, Agent, or Firm* — Birch, Stewart, Kolasch & Birch, LLP

(57) ABSTRACT

A method for forming a shallow trench isolation (STI) structure using two individual STI trench etching processes is provided. A first STI etching process forms first trenches with one or more sizes in rows along a first dimension in a silicon substrate. A first dielectric is filled in the first trenches following a first thermal oxidation forming a first liner oxide surrounding the first trenches. A second STI trench etching process forms second trenches with one or more sizes in a second dimension to define active regions separated from each other by the first trenches filled with the first dielectric material and second trenches. A second dielectric is filled in the second trenches following a second thermal oxidation forming a second liner oxide surrounding the second trenches. Active region encroachment caused by the first and second thermal oxidation is reduced by doing the two individual STI trench etching processes.

12 Claims, 22 Drawing Sheets

METHOD FOR FORMING A SHALLOW TRENCH ISOLATION STRUCTURE WITH REDUCED ENCROACHMENT OF ACTIVE REGIONS AND A SEMICONDUCTOR STRUCTURE THEREFROM

BACKGROUND OF THE INVENTION

Field of the Invention

The present invention relates to the field of semiconductor processing, and more particularly to a method of forming a shallow trench isolation (STI) structure capable of reducing the consumption or encroachment of the source/drain or active regions.

Description of the Prior Art

Shallow trench isolation (STI) structure provides electrical isolation between semiconductor devices. As the dimension of the devices continuously scales down, STI technique has become more and more important, and even confronting more challenge. FIG. 1A shows a schematic top view of a prior art semiconductor substrate structure and FIG. 1B shows a schematic cross sectional view of the prior art semiconductor substrate structure along the I-I' cutting line. The prior art semiconductor substrate includes a silicon substrate 10 with a plurality of active regions 12 isolated from each other by a shallow trench isolation structure formed of trenches 14. The active regions 12 are in an elliptical shape with round corners designated as A arising from silicon encroachment during a thermal oxidation process to form a liner oxide layer along sidewalls and bottoms of the trenches 14 prior to depositing an interlay oxide dielectric 16 to fill the trenches 14 and cover the silicon substrate 10. The formation of the liner oxide layer consumes silicon material of the silicon substrate 10 adjoining the trenches 14 such that the active regions 12 become the elliptical shape with round corners, and causing reduction of the areas at two ends of the active regions 12. The active regions 12 may be transistor regions of the semiconductor substrate structure with source/drain formed at the two ends of the active regions 12. A contact 18 with filled conductive material passes through the interlay oxide dielectric 16 and landing on the source/drain. As shown in FIG. 1A and FIG. 1B, the traditional shallow trench isolation process would decrease the contact landing area 18a if the contact 18 still lands on the two ends of the active regions 12 due to the round corners A arising from silicon encroachment or consumption during the formation of the oxide liner layer of the trenches 14. The smaller contact landing area 18a could induce high contact resistance, and it limits the capability of further shrinking of the semiconductor devices.

A traditional method for forming active regions and a shallow trench isolation (STI) structure for electrically isolating the active regions from each other is described below. Firstly, a semiconductor substrate structure including a silicon substrate 200 with a silicon oxide layer 202 as a pad oxide, a silicon nitride layer 204 and a photoresist layer or a hard mask 206 sequentially stacked over the silicon substrate 200 is provided, as shown in FIG. 2A, FIG. 2B and FIG. 2C. FIG. 2A is a schematic top view of the semiconductor substrate structure, FIG. 2B is a schematic cross sectional view of the semiconductor substrate structure along the C-C cutting line, and FIG. 2C is a schematic cross sectional view of the semiconductor substrate structure along the D-D cutting line. Next, performing a STI patterning process to form line-shape patterns on the semiconductor substrate structure, as shown in FIG. 3A, FIG. 3B and FIG. 3C. FIG. 3A is a schematic top view of the semiconductor substrate structure, FIG. 3B is a schematic cross sectional view of the semiconductor substrate structure along the C-C cutting line, and FIG. 3C is a schematic cross sectional view of the semiconductor substrate structure along the D-D cutting line. Then, performing active region-cut patterning to form island-shape active region patterns, as shown in FIG. 4A, FIG. 4B and FIG. 4C. FIG. 4A is a schematic top view of the semiconductor substrate structure, FIG. 4B is a schematic cross sectional view of the semiconductor substrate structure along the C-C cutting line, and FIG. 4C is a schematic cross sectional view of the semiconductor substrate structure along the D-D cutting line. Then, performing a trench etching process to form a shallow trench isolation structure with a plurality of trenches 208 in an interdigitated structure in the semiconductor substrate structure and removing the photoresist layer or hard mask 206, as shown in FIG. 5A, FIG. 5B and FIG. 5C. FIG. 5A is a schematic top view of the semiconductor substrate structure, FIG. 5B is a schematic cross sectional view of the semiconductor substrate structure along the C-C cutting line, and FIG. 5C is a schematic cross sectional view of the semiconductor substrate structure along the D-D cutting line. The shallow trench isolation structure defines active regions 200a and 200b adjoining each of the trenches 208 in the silicon substrate 200. The active regions 200a and 200b may be field effect transistors each of which with a source/drain at two ends of the active regions 200a, 200b, respectively. Thereafter, performing a thermal oxidation process to form a liner oxide layer 210 along sidewall walls and bottoms of the trenches 208. During the thermal oxidation process, the rectangular corners of the active regions 200a and 200b are exposed/or attacked by more oxygen-containing specie than other portions of the active regions 200a and 200b, for example, the rectangular corners of the active regions 200a and 200b are exposed/or attacked by oxygen-containing specie from at least two directions. Hence, silicon encroachment designated as A is enhanced at the corners of the active regions 200a and 200b to cause ellipse-shape active regions 200a and 200b with round corners, as shown in FIG. 6A, FIG. 6B and FIG. 6C. FIG. 6A is a schematic top view of the semiconductor substrate structure, FIG. 6B is a schematic cross sectional view of the semiconductor substrate structure along the C-C cutting line, and FIG. 6C is a schematic cross sectional view of the semiconductor substrate structure along the D-D cutting line. Then, the trenches 208 are filled with an oxide dielectric 212, and a chemical mechanic polish process follows to remove the excess oxide dielectric 212, as shown in FIG. 7A, FIG. 7B and FIG. 7C. FIG. 7A is a schematic top view of the semiconductor substrate structure, FIG. 7B is a schematic cross sectional view of the semiconductor substrate structure along the C-C cutting line, and FIG. 7C is a schematic cross sectional view of the semiconductor substrate structure along the D-D cutting line. Then, the silicon nitride layer 204 is removed from the semiconductor substrate structure, as shown in FIG. 8A, FIG. 8B and FIG. 8C. FIG. 8A is a schematic top view of the semiconductor substrate structure, FIG. 8B is a schematic cross sectional view of the semiconductor substrate structure along the C-C cutting line, and FIG. 8C is a schematic cross sectional view of the semiconductor substrate structure along the D-D cutting line. The active regions 200a and 200b is smaller and rounded at their two ends due to silicon encroachment. A contact 216 filled with a conductive material passing through the oxide dielectric 214 and landing on each of the two ends of the active regions 200a, 200b where the source/drain of the transistor may be formed. The contact landing area B of the contact 216 is reduced due to silicon encroachment at the two ends of the active regions 200a, 200b, as shown in FIG. 9A and FIG. 9B. FIG. 9A is a schematic top view of the semiconductor substrate structure, and FIG. 9B is a schematic cross sectional view of the semiconductor substrate structure along the D-D cutting line.

SUMMARY OF THE INVENTION

The present invention aims to alleviate the area reduction of the active regions due to silicon encroachment or consumption of the active regions at the fabrication of a shallow trench isolation structure with proposing two individual STI trench etching processes. A first STI etching process is performed to form first trenches with one or more sizes in a line shape along a first dimension in a silicon substrate. A first dielectric is filled in the first trenches following a first thermal oxidation process forming a first liner oxide along sidewalls and bottoms of the first trenches. A second STI trench etching process is performed to form second trenches with one or more sizes along a second dimension to define island-shaped active regions of the silicon substrate, which have one or more sizes and are separated from each other by the first and second trenches. A second dielectric is filled in the second trenches following a second thermal oxidation process forming a second liner oxide along sidewalls and bottoms of the second trenches. A silicon encroachment or consumption of active regions adjoining the first and second trenches caused by the first and second thermal oxidation processes is reduced by doing the two individual STI trench etching processes at different stages of the fabrication of the shallow trench isolation structure. Therefore, the island-shaped active regions with two ends not rounded as much as that formed by the traditional STI formation process are provided. The two ends of the island-shaped active regions would give more area for subsequent contact landing. Contacts can be landed on the ends of the island-shaped active regions with adequate landing area and can reduce the contact resistivity. The etching depth of the two individual STI etching processes can be adjusted separately, which gives more flexibility on etching selectivity, critical dimension (CD) and pattern density consideration.

To attain the above purposes, in an embodiment, a method for forming a shallow trench isolation structure with reduced encroachment of active regions of a silicon substrate includes providing a silicon substrate; forming a pad oxide layer on an upper surface of the silicon substrate; forming a silicon nitride layer on the pad oxide layer; forming a first pattern on the silicon nitride layer, wherein the first pattern is composed of lines aligned in rows along a first dimension, or the first pattern is composed of a first sub-pattern and a second sub-pattern, wherein the first sub-pattern is composed of lines aligned in rows along a first dimension and the second sub-pattern contains openings with one or more sizes aligned in rows along the first dimension; using the first pattern as a mask and performing a first trench etching process to form a plurality of first trenches along the first dimension, wherein the first trenches have one or more sizes; removing the first pattern; performing a first thermal oxidation process to form a first liner oxide on sidewalls and bottoms of the first trenches; filling the first trenches with a first dielectric material; forming a second pattern with active-area-defined portions on the silicon substrate, wherein the active-area-defined portions have one or more sizes; using the second pattern as a mask and performing a second trench etching process to form a plurality of second trenches in a second dimension to define a plurality of the active regions of the silicon substrate, and the active regions are separated from each other by the first trenches filled with the first dielectric material and the second trenches, wherein the active regions has one or more sizes and the second trenches have one or more sizes; performing a second thermal oxidation process to form a second liner oxide on sidewalls and bottoms of the second trenches; and filing the second trenches with a second dielectric material.

In an implementation, the present shallow trench isolation structure is constituted by the first trenches and the second trenches in an interdigitated form with a size of the first trench different from that of the second trench.

In an implementation, the active regions separated from each other by the first trenches and the second trenches in an interdigitated form are used for forming memory IC transistors or logic IC transistors.

In another aspect, the present invention provides a semiconductor structure comprising a silicon substrate; a plurality of first trenches with one or more sizes filled with a first dielectric material formed in the silicon substrate along a first dimension; a plurality of second trenches with one or more sizes filled with a second dielectric material formed in the silicon substrate along a second dimension; and a plurality of active regions with one or more sizes formed in the silicon substrate, wherein each of the active regions is rectangular-shaped with round corners and separated from each other by the first trenches filled with the first dielectric material and the second trenches filled with the second dielectric material.

BRIEF DESCRIPTION OF THE DRAWINGS

Other objects and advantages of the invention will become apparent upon reading the following detailed description and upon reference to the accompanying drawings in which:

FIG. 2A through FIG. 9A are respective schematic top views of the prior art semiconductor substrate structure at various stages of a traditional method for forming the semiconductor substrate structure;

FIG. 2B through FIG. 8B are respective schematic cross-sectional views of the prior art semiconductor substrate along the C-C cutting line of FIG. 2A through FIG. 8A, respectively;

FIG. 2C through FIG. 8C, and FIG. 9B are respective schematic cross-sectional views of the prior art semiconductor substrate along the D-D cutting line of FIG. 2A through FIG. 9A, respectively;

FIG. 10A through FIG. 20A are respective schematic top views of a semiconductor substrate structure at various stages of a method for forming a semiconductor substrate structure according to a first embodiment of the present invention;

FIG. 10B through FIG. 19B are respective schematic cross-sectional views of the semiconductor substrate structure along the C-C cutting line of FIG. 10A through FIG. 19A, respectively;

FIG. 10C through FIG. 19C are respective schematic cross-sectional views of the semiconductor substrate structure along the D-D cutting line of FIG. 10A through FIG. 19A, respectively;

DETAILED DESCRIPTION OF THE PREFERRED EMBODIMENTS

Figure 1A:
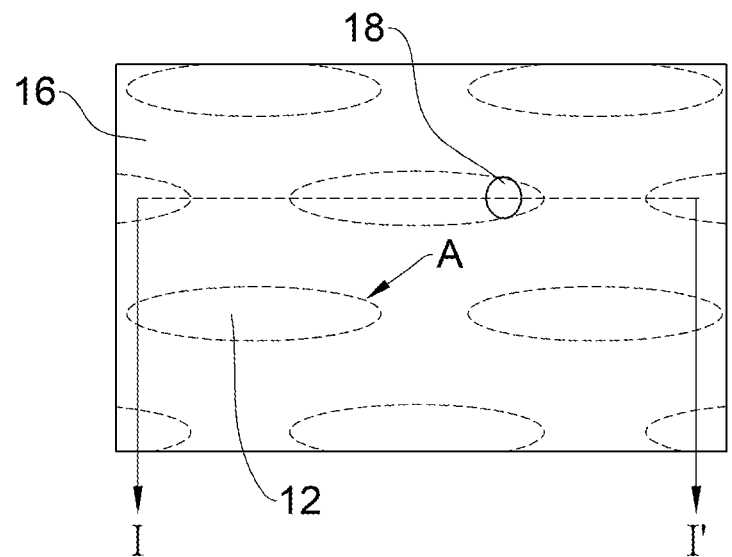
FIG. 1A is a schematic top view of a prior art semiconductor substrate structure.
Figure 1B:
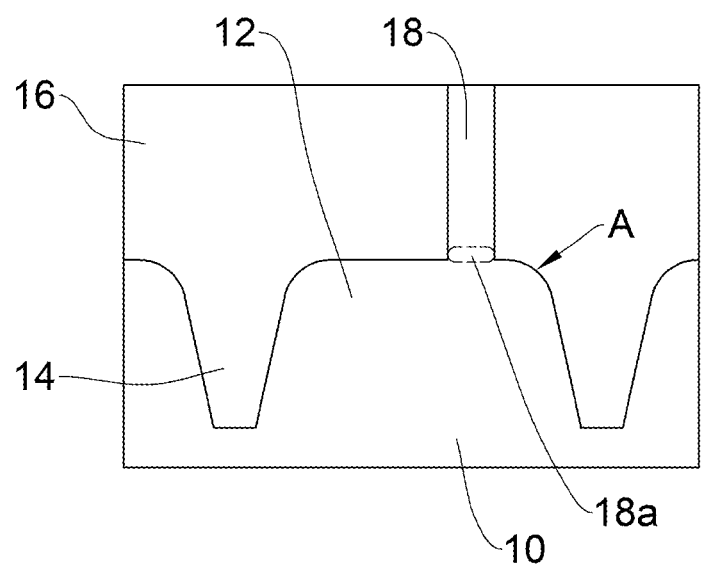
FIG. 1B is a schematic cross sectional view of the prior art semiconductor substrate along the I-I' cutting line.
Figure 2A:
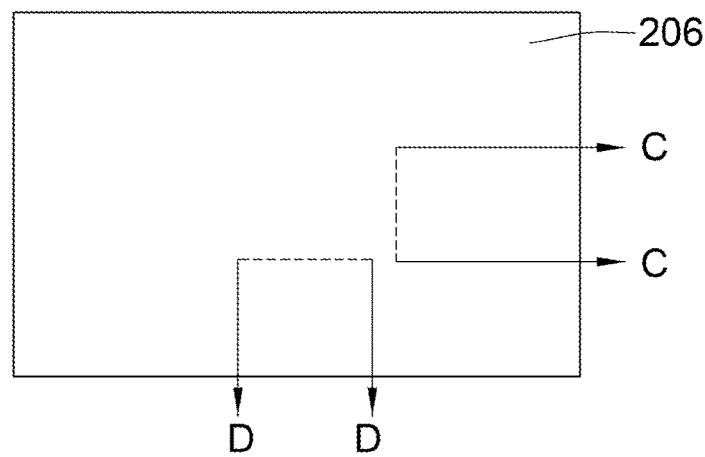
Figure 2B:
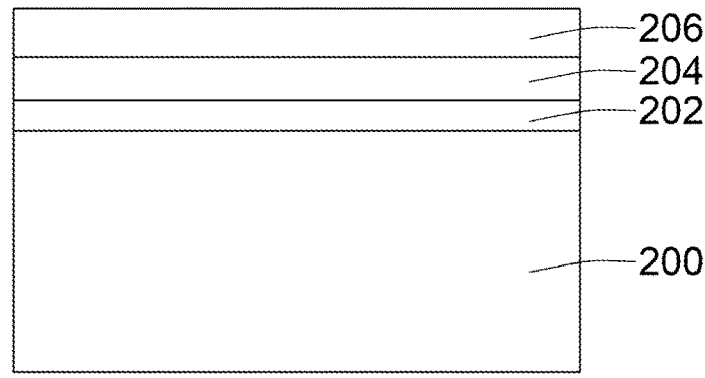
Figure 2C:
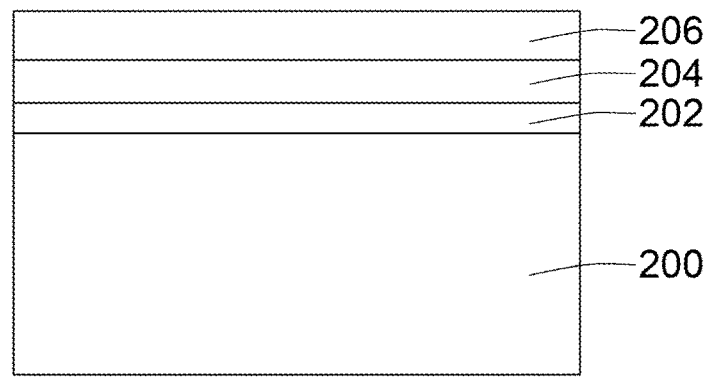
Figure 3A:
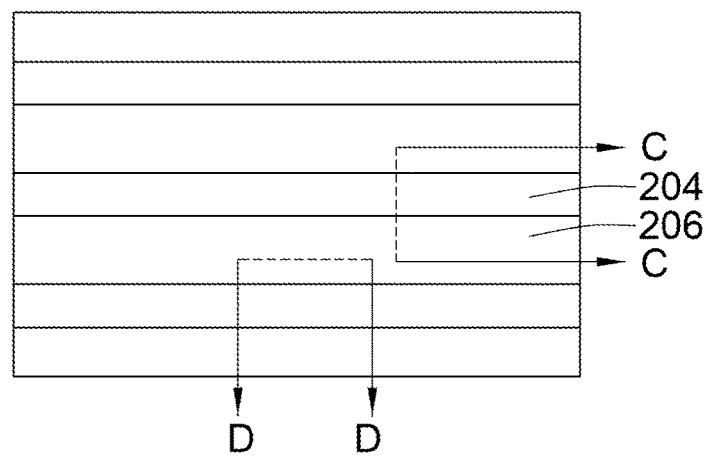
Figure 3B:
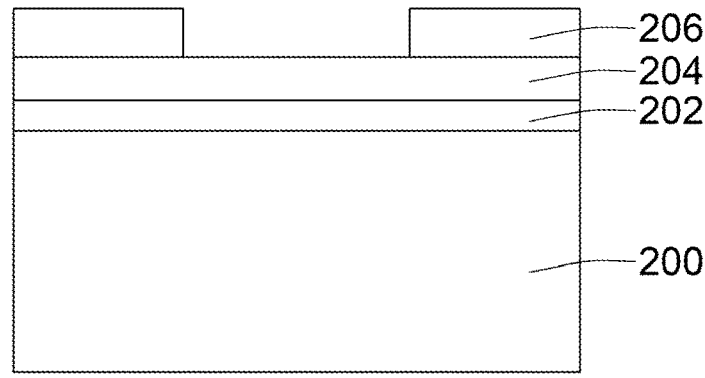
Figure 3C:
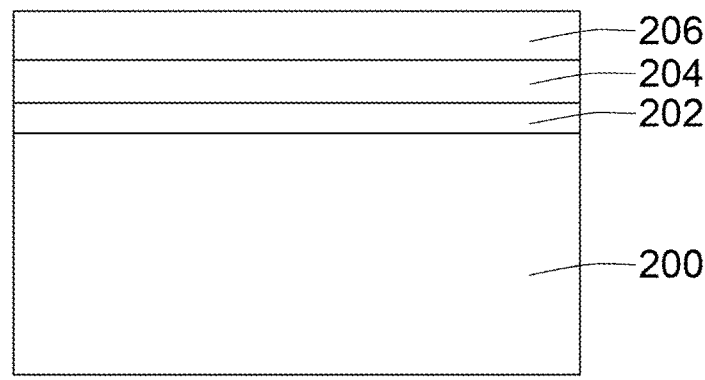
Figure 4A:
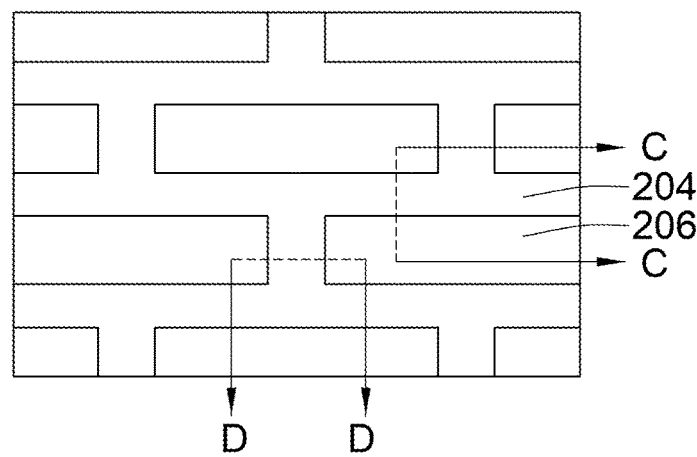
Figure 4B:
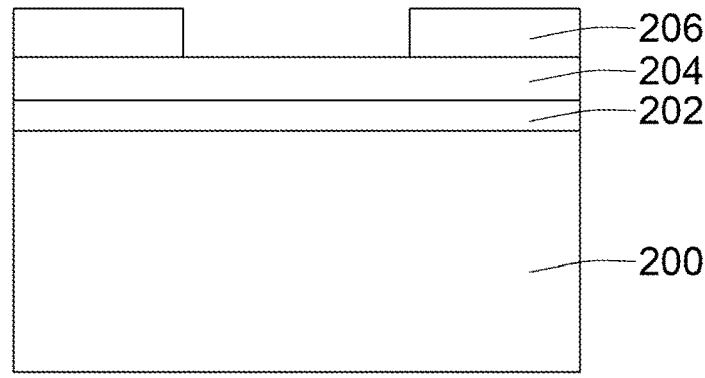
Figure 4C:
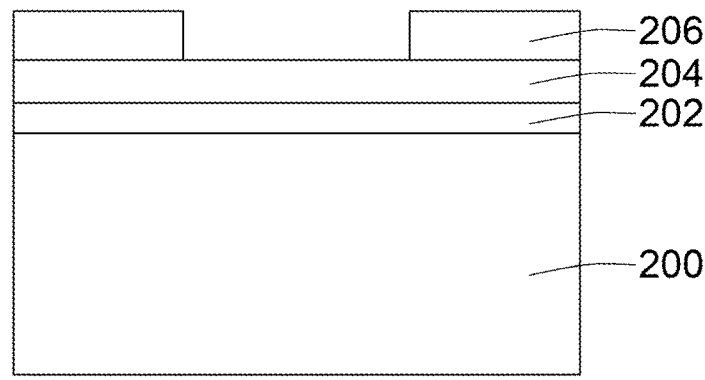
Figure 5A:
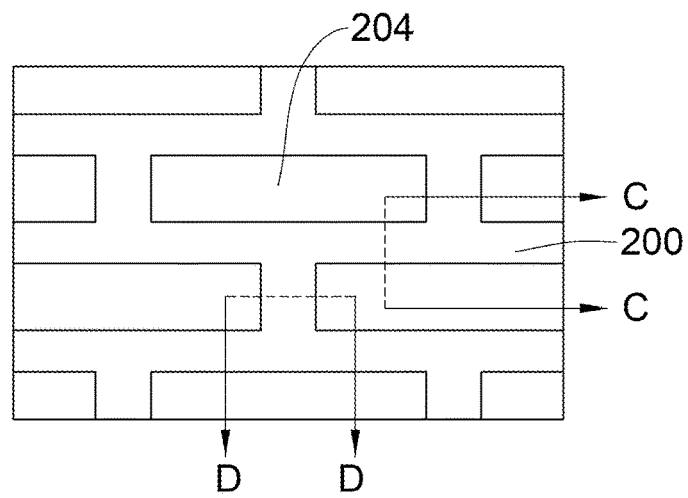
Figure 5B:
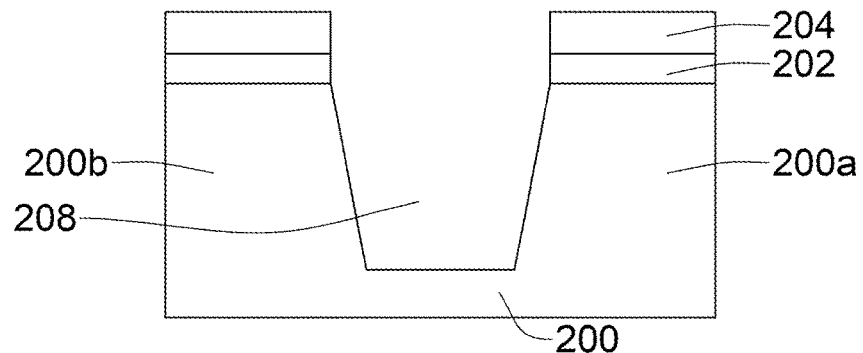
Figure 5C:
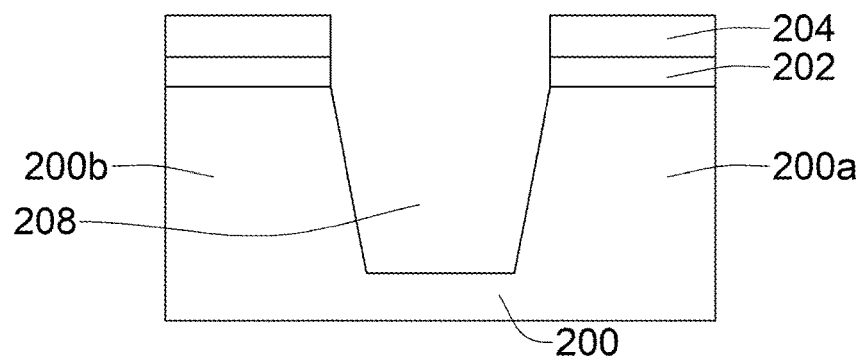
Figure 6A:
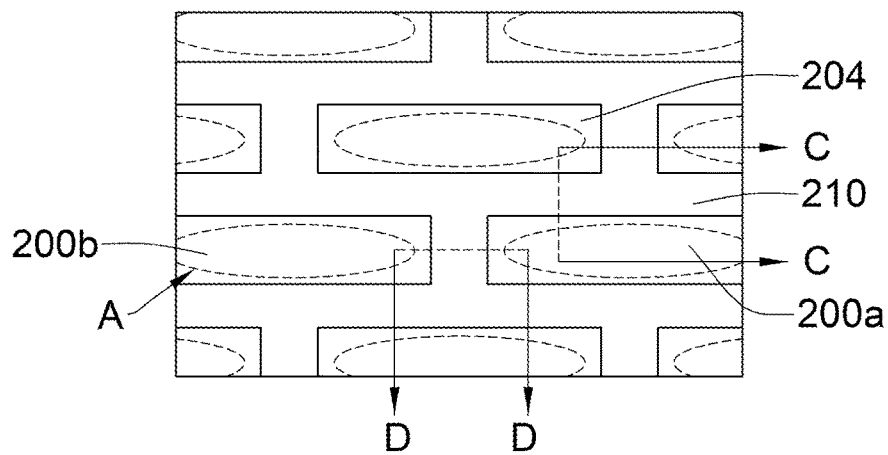
Figure 6B:
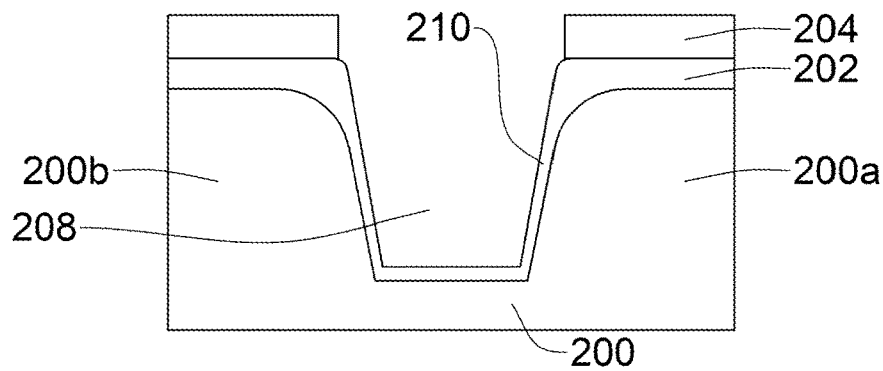
Figure 6C:
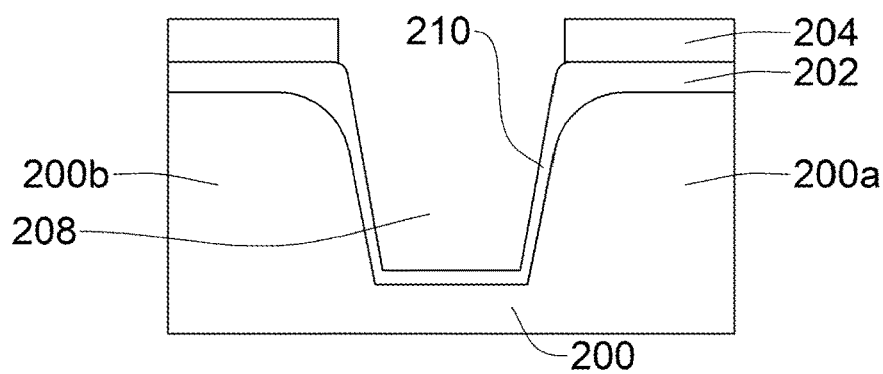
Figure 7A:
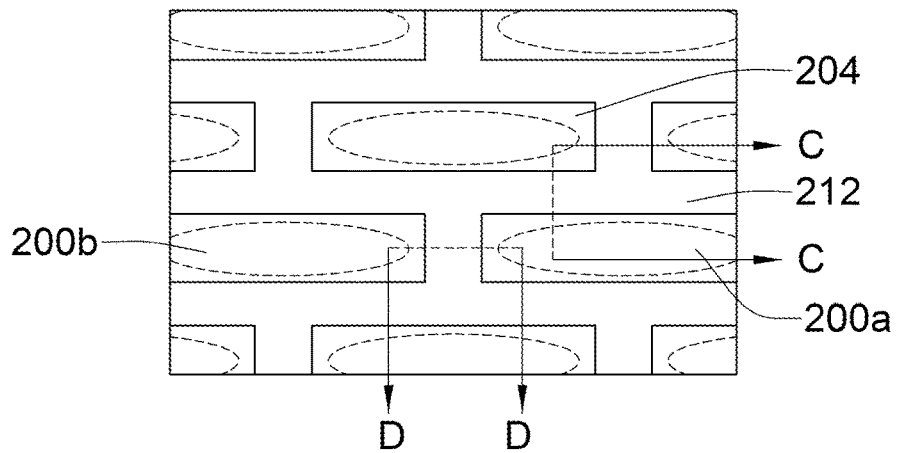
Figure 7B:
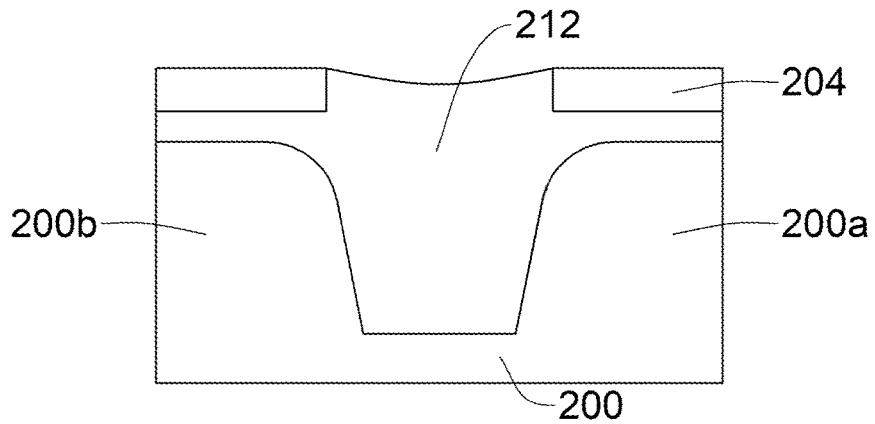
Figure 7C:
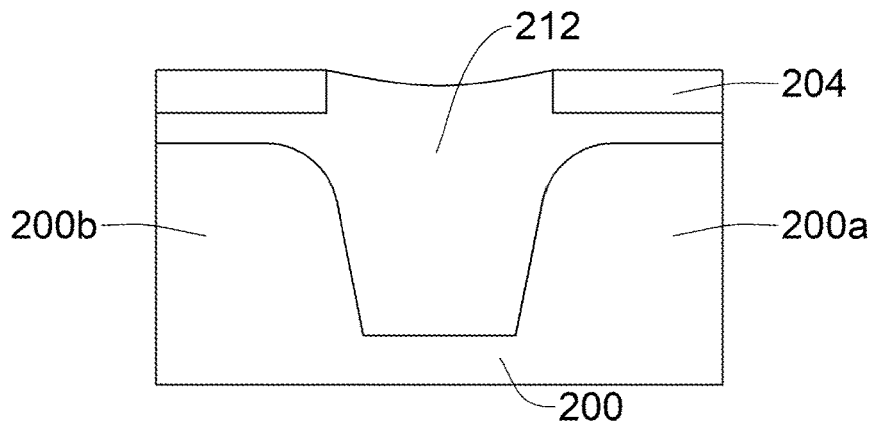
Figure 8A:
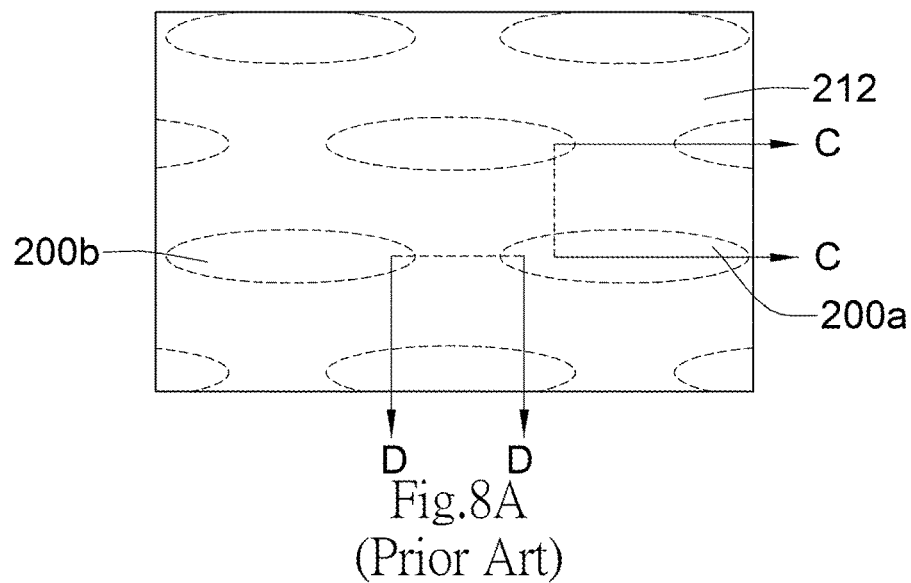
Figure 8B:
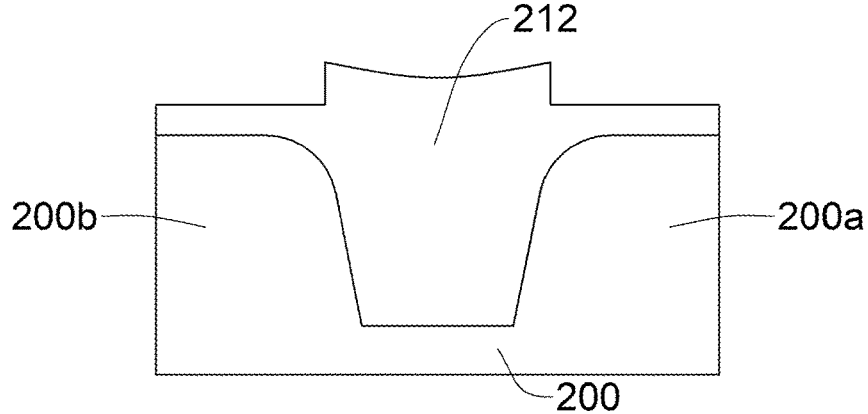
Figure 8C:
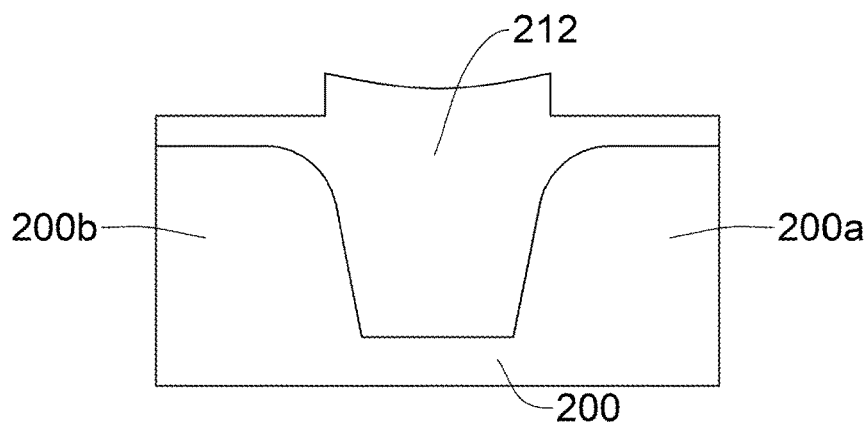

The present invention will now be described by way of preferred embodiments with references to the accompanying drawings. Like numerals refer to corresponding parts of various drawings. Please note well-known circuits, structures and techniques may not be shown in detail in order not to obscure the aspects of the disclosure. Various embodiments will be disclosed herein. However, it is to be understood that the disclosed embodiments are only used as an illustration that can be embodied in various forms. In addition, each of the examples given in connection with the various embodiments are intended to be illustrative but not limiting to. Further, the figures are not necessarily conform to the sizes and dimension ratios of actual structures, and some features are magnified to show details of particular components (and any dimensions, materials, and similar details shown in the figures are intended to be illustrative and not limiting to). Therefore, the particular structural and functional details are disclosed herein are not interpreted as limitations, but are used only to teach those skilled in the relevant field technicians to practice the basis of the disclosed embodiments.

Turning now to the drawings, FIG. 10 through FIG. 20 depict a presently preferred processing sequence for producing a shallow trench isolation structure capable of reducing encroachment or consumption of active regions of a semiconductor substrate structure during the present semiconductor processing in accordance with the first embodiment of the present invention. Firstly, a semiconductor substrate structure including a silicon substrate 300 is provided, a silicon oxide layer 302, a silicon nitride layer 304 and a photoresist layer or hard mask 306 are sequentially stacked over the silicon substrate 300, for example by well-known methods, as shown in FIG. 10A, FIG. 10B and FIG. 10C. FIG. 10A is a schematic top view of the semiconductor substrate structure, FIG. 10B is a schematic cross sectional view of the semiconductor substrate structure along the C-C cutting line, and FIG. 10C is a schematic cross sectional view of the semiconductor substrate structure along the D-D cutting line. The silicon oxide layer 302 may be served as a pad oxide layer capable of preventing active regions subsequently formed from chemical contamination during following steps for forming the present semiconductor substrate structure with active regions isolated to each other by the present shallow trench isolation structure. The silicon nitride layer 304 may be served as a hard mask to protect the active regions during a deposition of an interlayer dielectric material to fill trenches adjoining the active regions in subsequent processing steps. The silicon nitride layer 304 also may be used as a polish stop when performing a chemical mechanical polish process to remove the excess interlayer dielectric material from the semiconductor substrate structure. Then, performing a first STI patterning process to form line-shape patterns on the silicon nitride layer 304. In an embodied example, a first pattern composed of a plurality of patterned lines of photoresist 306 in a first dimension is formed on the silicon nitride layer 304, as shown in FIG. 11A, FIG. 11B and FIG. 11C. FIG. 11A is a schematic top view of the semiconductor substrate structure, FIG. 11B is a schematic cross sectional view of the semiconductor substrate structure along the C-C cutting line, and FIG. 11C is a schematic cross sectional view of the semiconductor substrate structure along the D-D cutting line. Then, performing a first trench etching process to form a plurality of first trenches 307 in the silicon substrate 300 in the first dimension, and after that, the first pattern is removed, as shown in FIG. 12A, FIG. 12B and FIG. 12C. FIG. 12A is a schematic top view of the semiconductor substrate structure, FIG. 12B is a schematic cross sectional view of the semiconductor substrate structure along the C-C cutting line, and FIG. 12C is a schematic cross sectional view of the semiconductor substrate structure along the D-D cutting line. The etching depth and critical dimension (CD) of the first trenches 307 may be adjustable as desired. Then, performing a first thermal oxidation process to form a first liner oxide 308 on sidewalls and bottoms of the first trenches 307. In an embodied example, the first thermal oxidation process is performed in an oxidation chamber with the oxidation chamber ambient comprises an oxygen bearing specie. During the first thermal oxidation process, only the portions of the silicon substrate 300 defining the sidewalls and bottoms of the first trenches 307 in the first dimension are exposed the oxygen-bearing specie to form the first liner oxide 308 along the sidewalls and bottoms of the first trenches 307, as shown in FIG. 13A, FIG. 13B and FIG. 13C. FIG. 13A is a schematic top view of the semiconductor substrate structure, FIG. 13B is a schematic cross sectional view of the semiconductor substrate structure along the C-C cutting line, and FIG. 13C is a schematic cross sectional view of the semiconductor substrate structure along the D-D cutting line. As a result, silicon encroachment of the silicon substrate 300 caused by the first thermal oxidation process only happens on one direction along the first dimension. Please see FIG. 14A, FIG. 14B and FIG. 14C, in which FIG. 14A is a schematic top view of the semiconductor substrate structure, FIG. 14B is a schematic cross sectional view of the semiconductor substrate structure along the C-C cutting line, and FIG. 14C is a schematic cross sectional view of the semiconductor substrate structure along the D-D cutting line. Following, the first trenches 307 are filled with a first dielectric material 310. In an embodied example, the first trenches 307 may be filled with oxide dielectric, for example silicon dioxide. The silicon dioxide may be deposited in the first trenches 307 by CVD method. Then, performing a first chemical mechanic polish (CMP) process to remove the excess first dielectric material 310 with the silicon nitride layer 304 as a polish stop.

Figure 9A:
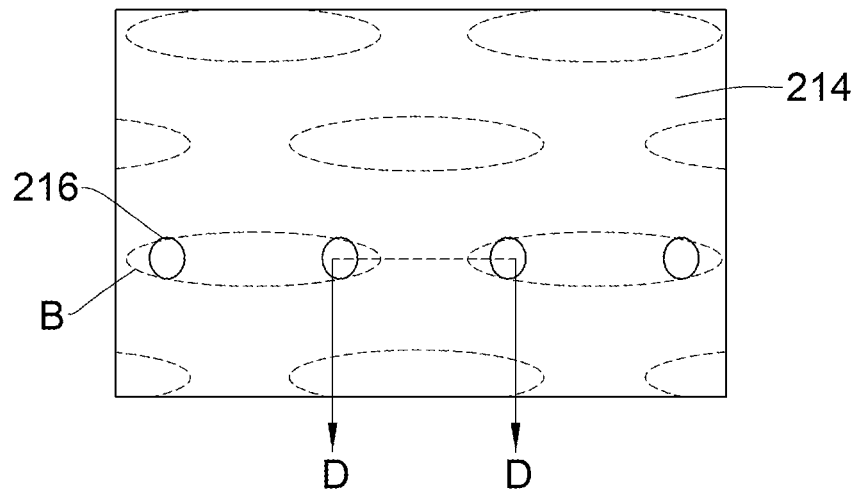
Figure 9B:
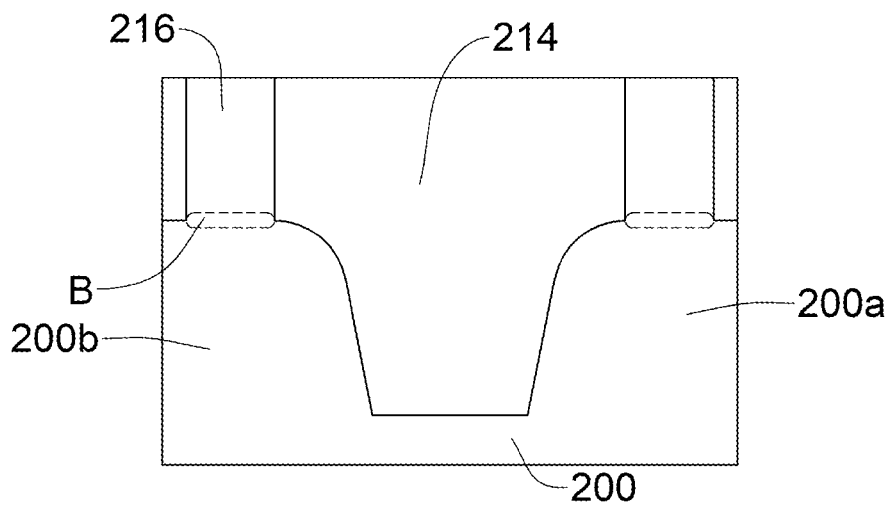
Figure 10A:
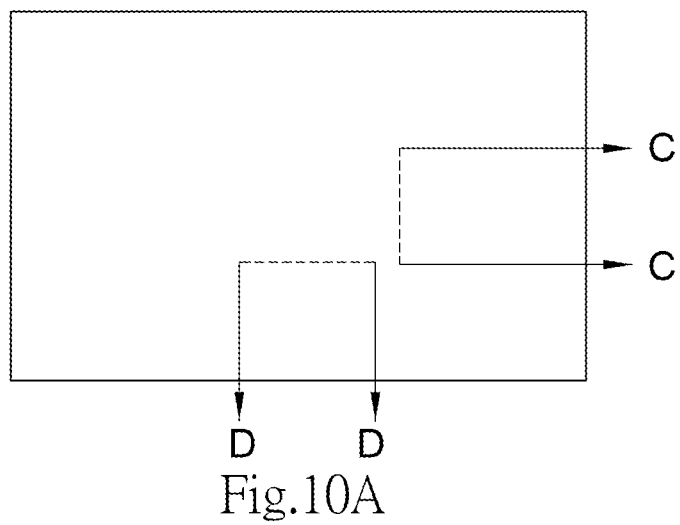
Figure 10B:
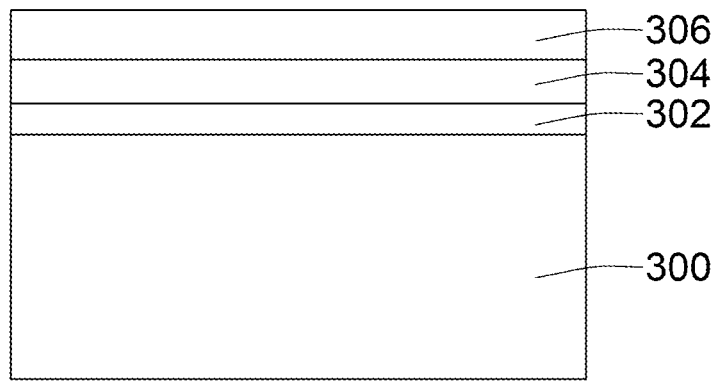
Figure 10C:
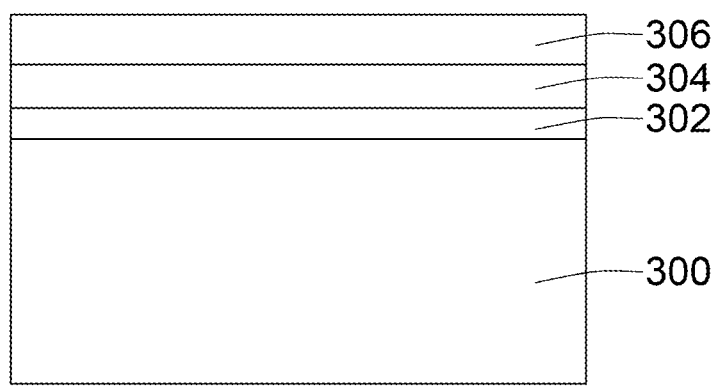
Figure 11A:
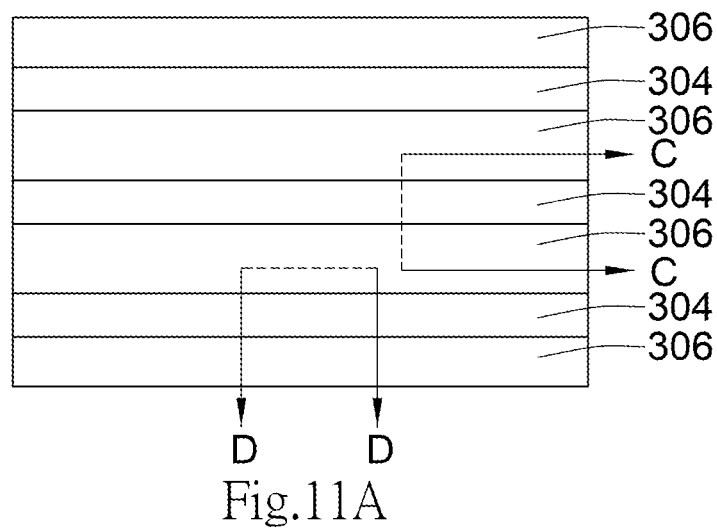
Figure 11B:
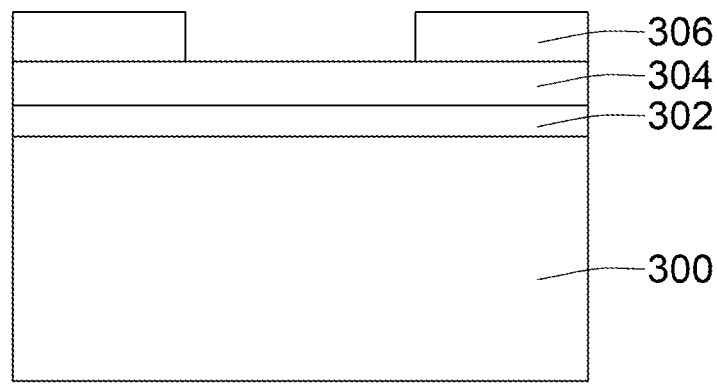
Figure 11C:
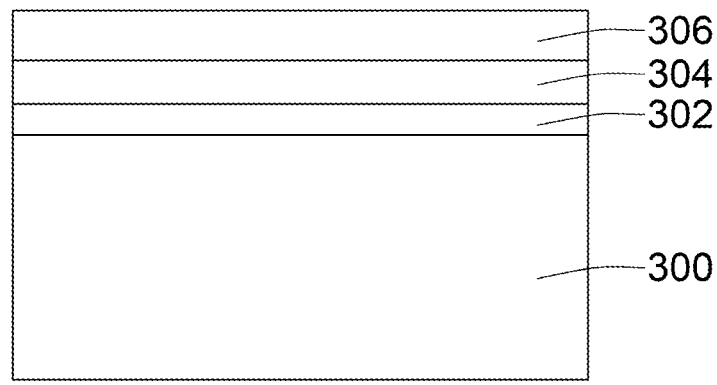
Figure 12A:
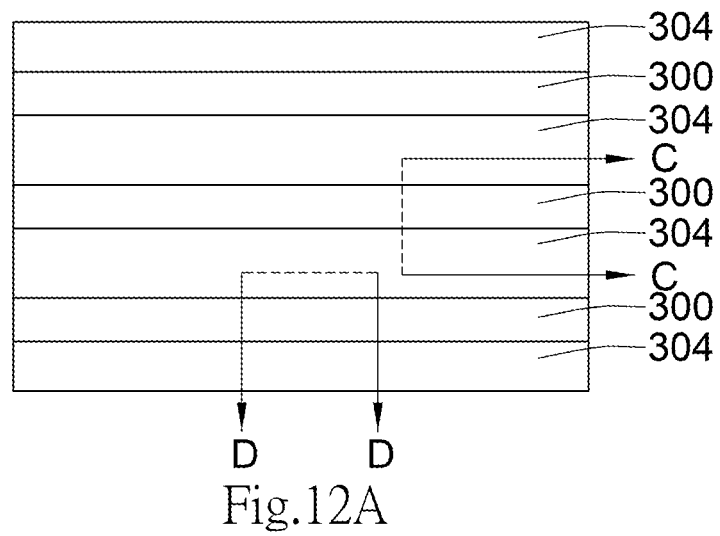
Figure 12B:
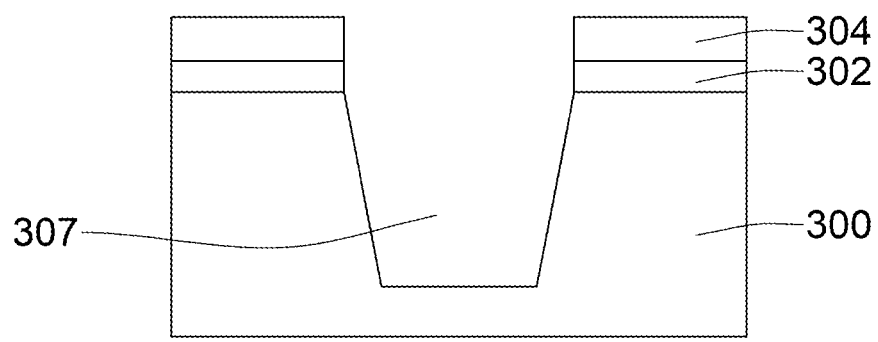
Figure 12C:
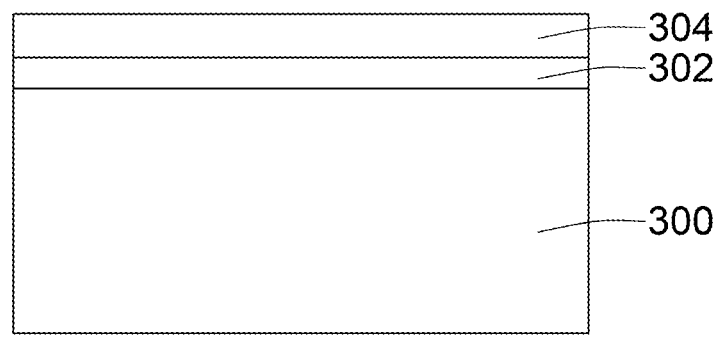
Figure 13A:
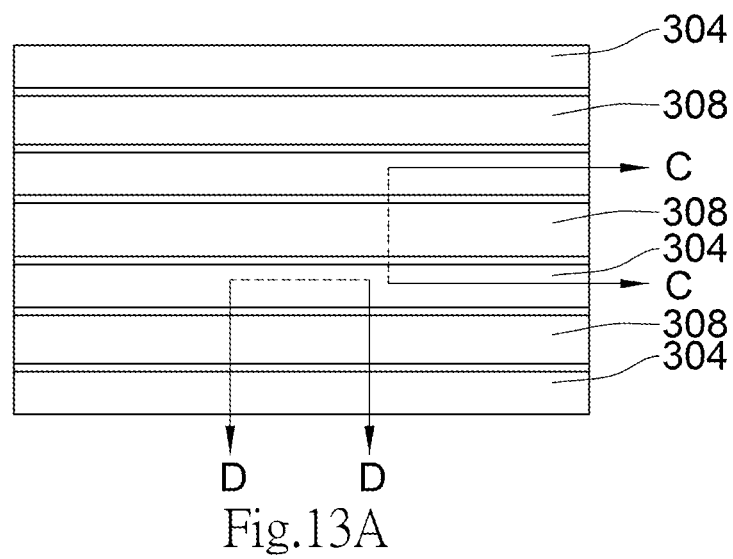
Figure 13B:
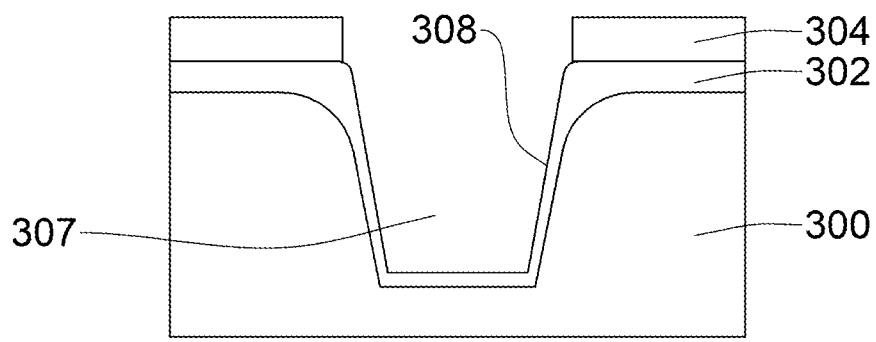
Figure 13C:
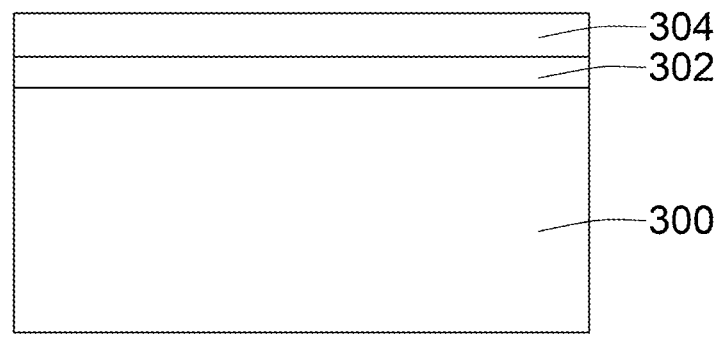
Figure 14A:
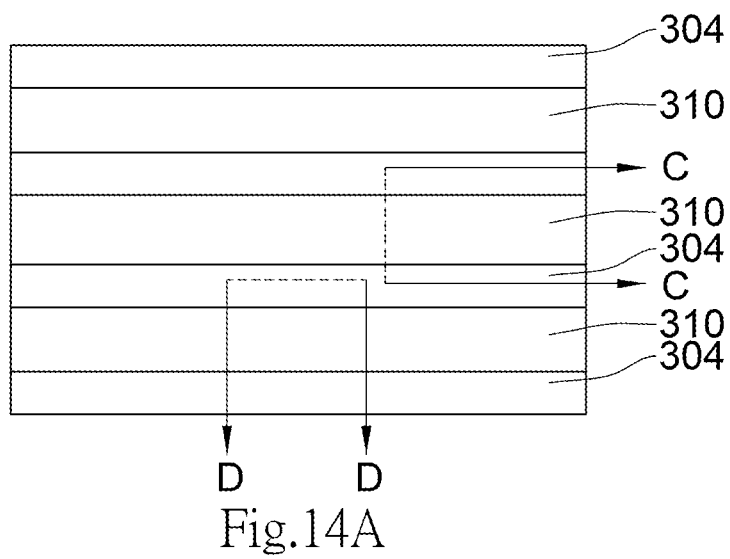
Figure 14B:
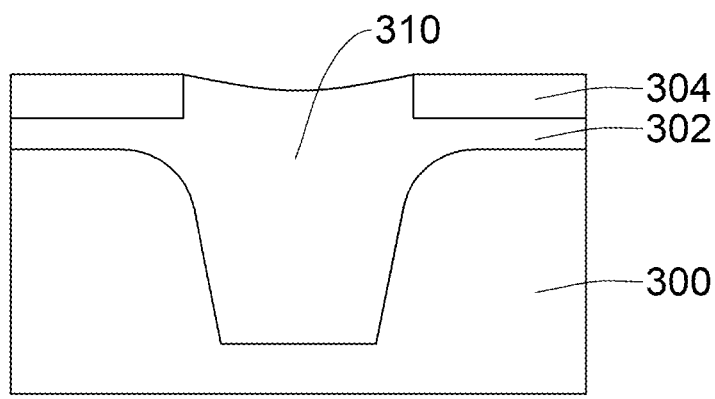
Figure 14C:
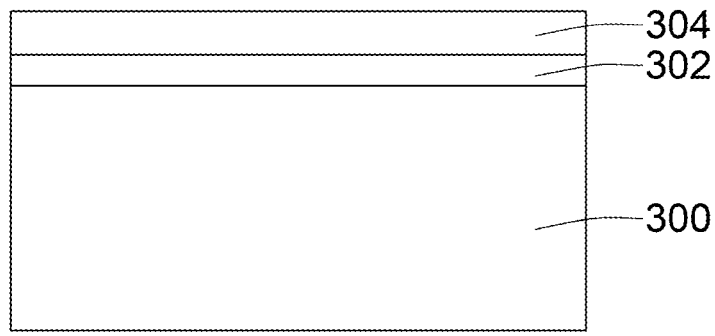
Figure 15A:
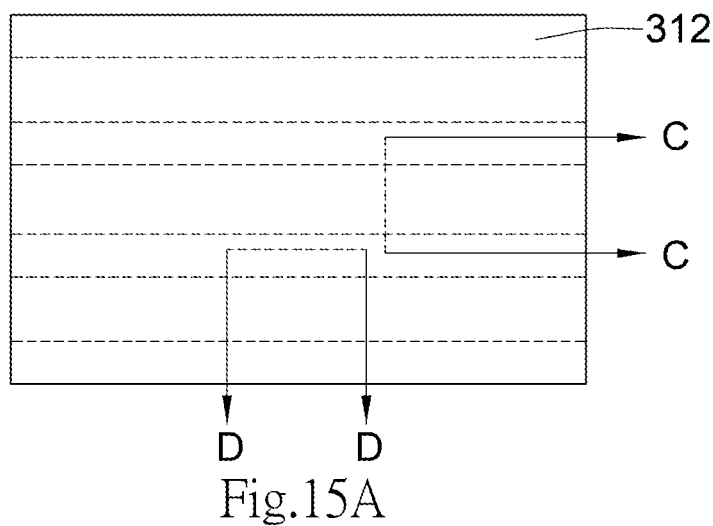
Figure 15B:
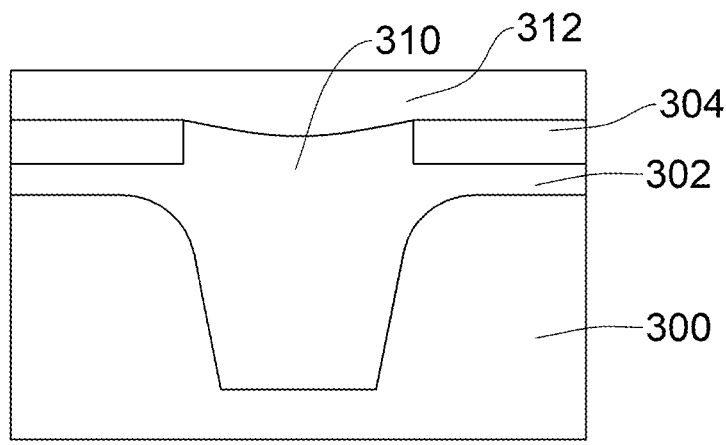
Figure 15C:
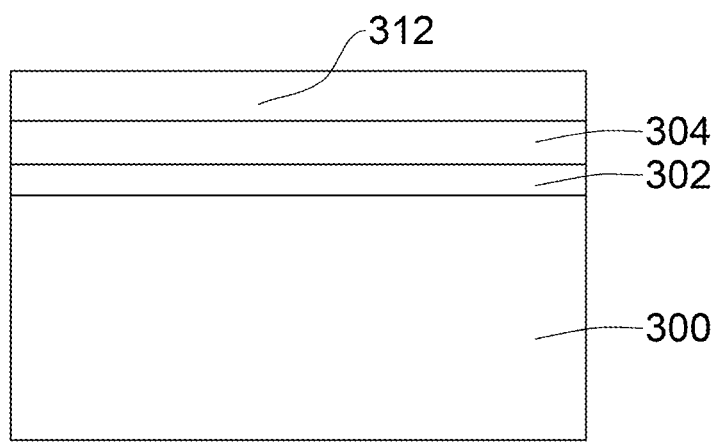
Figure 16A:
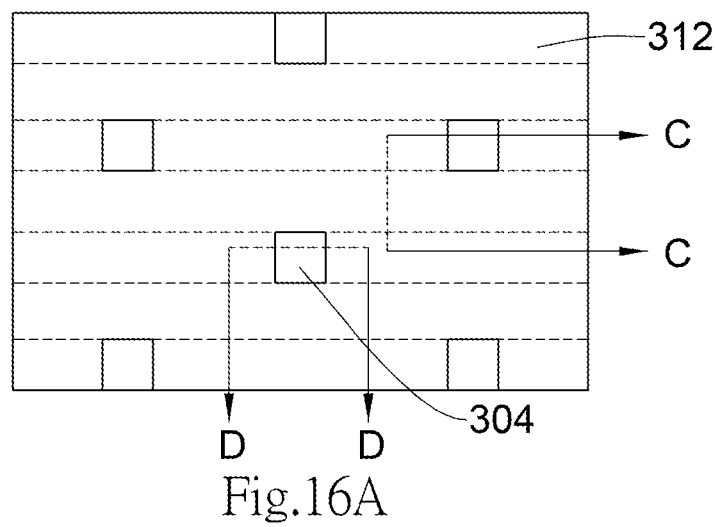
Figure 16B:
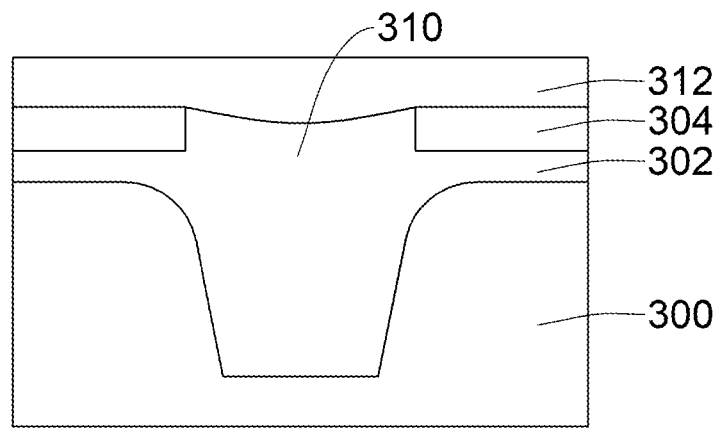
Figure 16C:
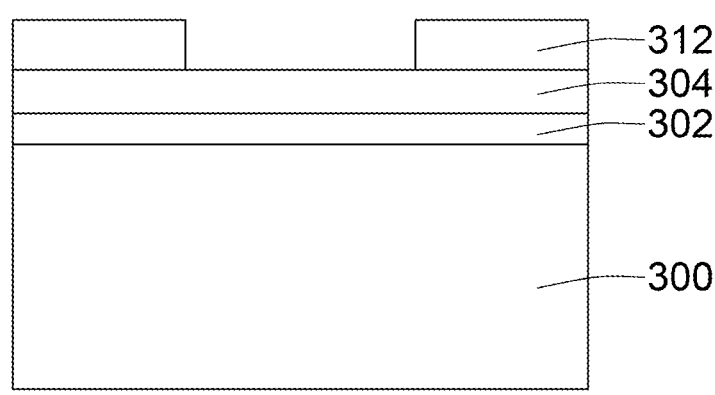
Figure 17A:
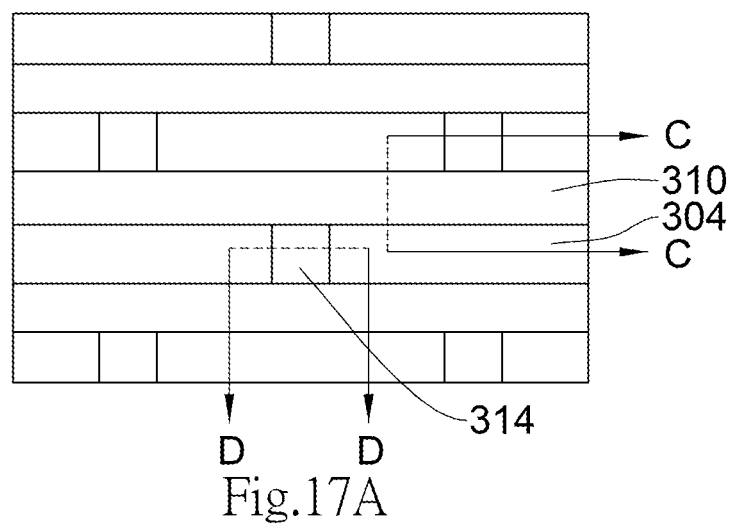
Figure 17B:
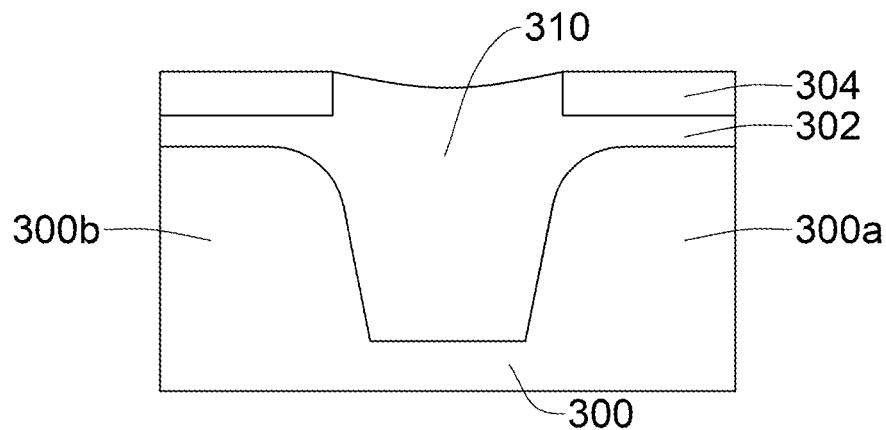
Figure 17C:
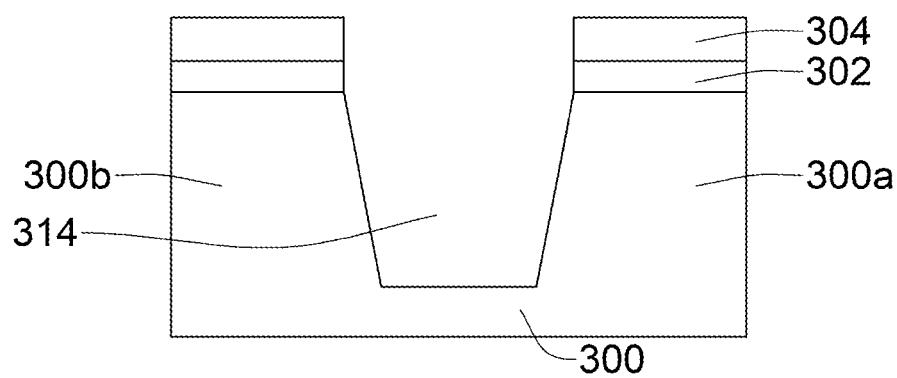
Figure 18A:
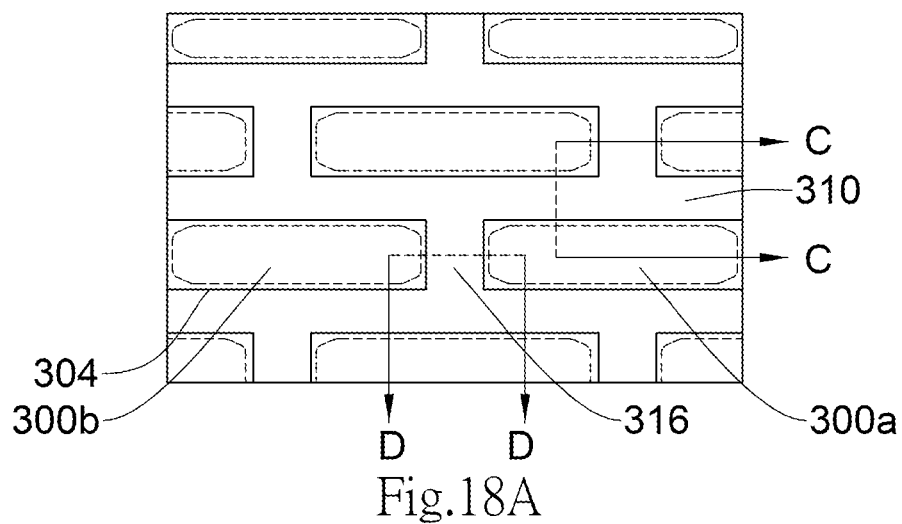
Figure 18B:
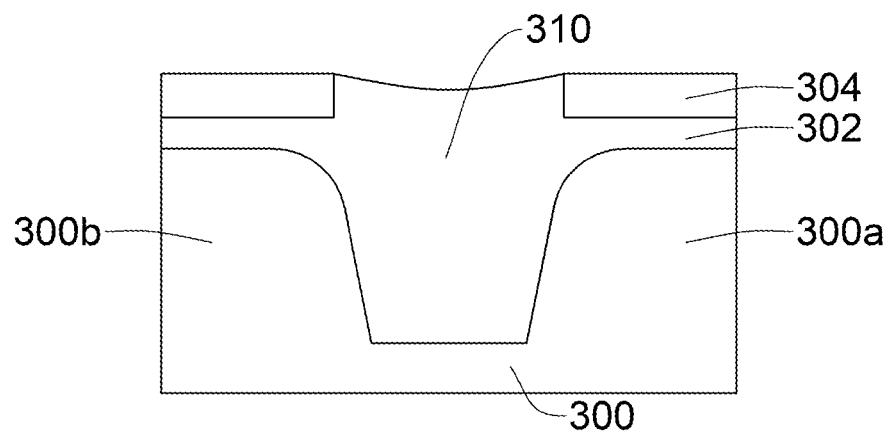
Figure 18C:
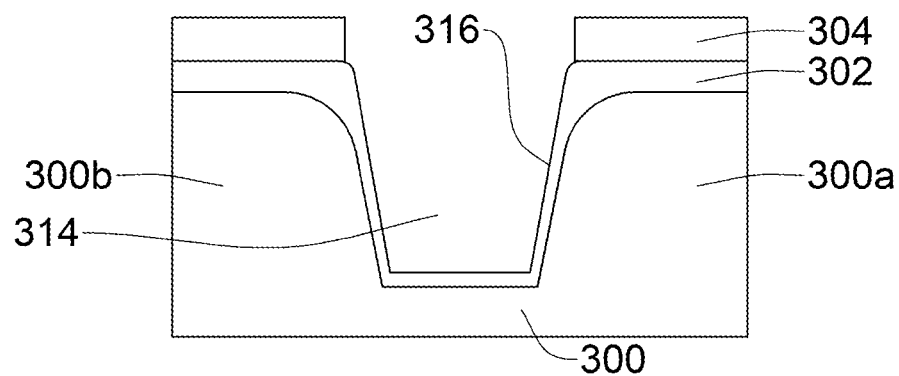
Figure 19A:
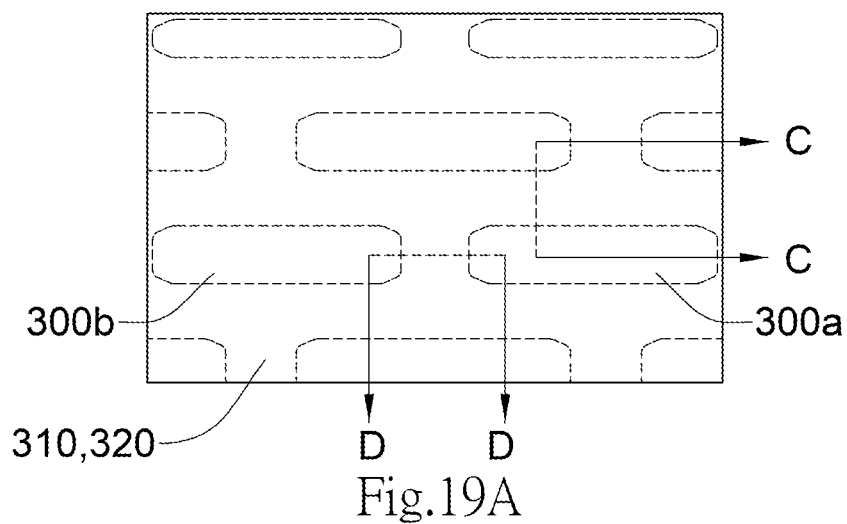
Figure 19B:
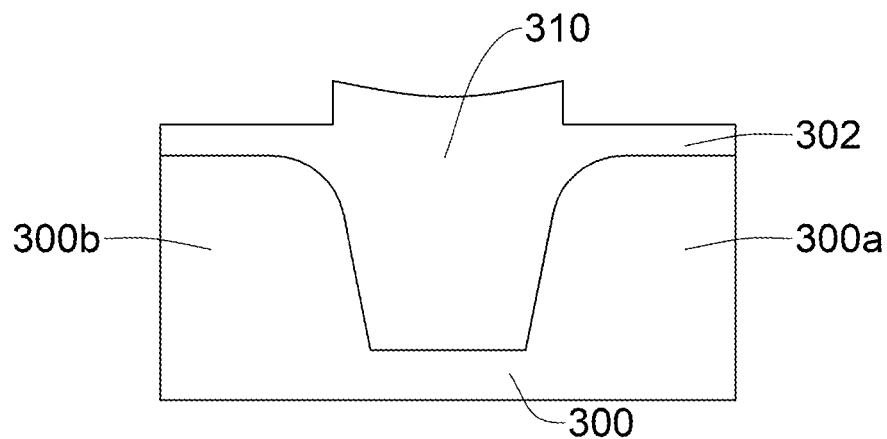
Figure 19C:
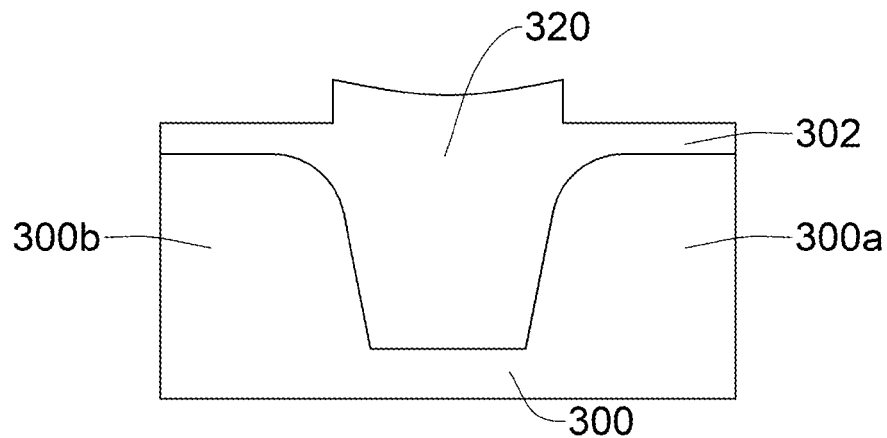

Subsequently, forming a second photoresist layer or a second hard mask 312 on the silicon nitride layer 304 of the semiconductor substrate structure, as shown in FIG. 15A, FIG. 15B and FIG. 15C. FIG. 15A is a schematic top view of the semiconductor substrate structure, FIG. 15B is a schematic cross sectional view of the semiconductor substrate structure along the C-C cutting line, and FIG. 15C is a schematic cross sectional view of the semiconductor substrate structure along the D-D cutting line. Then, patterning the second photoresist layer or a second hard mask 312 to form a second pattern as an active-region-defined pattern for cutting active regions of the silicon substrate 300 in a subsequent step, as shown in FIG. 16A, FIG. 16B and FIG. 16C. FIG. 16A is a schematic top view of the semiconductor substrate structure, FIG. 16B is a schematic cross sectional view of the semiconductor substrate structure along the C-C cutting line, and FIG. 16C is a schematic cross sectional view of the semiconductor substrate structure along the D-D cutting line. A second trench etching process is performed to form a plurality of second trenches 314 in a second dimension so as to define a plurality of active regions 300a, 300b of the silicon substrate 300, as shown in FIG. 17A, FIG. 17B and FIG. 17C, in which FIG. 17A is a schematic top view of the semiconductor substrate structure, FIG. 17B is a schematic cross sectional view of the semiconductor substrate structure along the C-C cutting line, and FIG. 17C is a schematic cross sectional view of the semiconductor substrate structure along the D-D cutting line, the active regions 300a, 300b are divided from each other by the first trenches 307 filled with the first dielectric material 310 and the second trenches 314. Then, the second pattern is removed. In an embodied example, the first trenches 307 and the second trenches 314 constitute an interdigitated structure to define active regions 300a, 300b to be formed as memory IC transistors. Please note one skilled artisan in the field will appreciate any desired interdigitated structure constituted by the first trenches and second trenches defining active regions proper for logic IC transistors may be obtained from a teaching of the present disclosure. The etching depth and critical dimension of the second trenches 314 may be adjustable to be differentiated from the first trenches 307. In other words, a shallow trench isolation structure formed of the first trenches 307 and the second trenches 314 in an interdigitated form could have a first depth defined by the first trench 307 different from a second depth defined by the second trench 314. Subsequently, performing a second thermal oxidation process to form a second liner oxide 316 on sidewalls and bottoms of the second trenches 314 as shown in FIG. 18A, FIG. 18B and FIG. 18C. FIG. 18A is a schematic top view of the semiconductor substrate structure, FIG. 18B is a schematic cross sectional view of the semiconductor substrate structure along the C-C cutting line, and FIG. 18C is a schematic cross sectional view of the semiconductor substrate structure along the D-D cutting line. In an embodied example, the second thermal oxidation process is performed in an oxidation chamber with the oxidation chamber ambient comprises an oxygen bearing specie. During the second thermal oxidation process, only the portions of the silicon substrate 300 defining the sidewalls and bottoms of the second trenches 314 in the second dimension are exposed the oxygen-bearing specie, while the first trenches 307 are filled with the first dielectric material 310 to block the first trenches 307 from being exposed the oxygen-bearing specie. Silicon encroachment of the silicon substrate 300 caused by the second thermal oxidation process only happens on one direction along the second dimension. Silicon encroachment would not be as serious as the traditional method shown in FIG. 2 through FIG. 9. So, the active regions 300a, 300b with two ends larger than that of the active regions 200a, 200b may be obtained. In other words, the active regions 300a, 300b may become a rectangular shape with slight round corners. The active regions 300a, 300b may be served as transistors with their source/drain regions occupying at the two ends of the active regions 300a, 300b. Compared to the contact landing area B of the prior art semiconductor substrate structure as shown in FIG. 9A and FIG. 9B, the two ends of the active regions 300a, 300b of the present semiconductor substrate structure would provide larger contact landing areas for contacts landing on the source/drain regions of the transistors. Please refer to FIG. 19A, FIG. 19B and FIG. 19C. FIG. 19A is a schematic top view of the semiconductor substrate structure, FIG. 19B is a schematic cross sectional view of the semiconductor substrate structure along the C-C cutting line, and FIG. 19C is a schematic cross sectional view of the semiconductor substrate structure along the D-D cutting line. The second trenches 314 are filled with a second dielectric material 320. In an embodied example, the second trenches 314 may be filled with oxide dielectric, for example silicon dioxide. The silicon dioxide may be deposited in the second trenches 314 by CVD method, and then performing a second chemical mechanic polish process to remove the excess second dielectric material 320 with the silicon nitride layer 304 as a polish stop. Then, the silicon nitride layer 304 is removed.

Figure 20A:
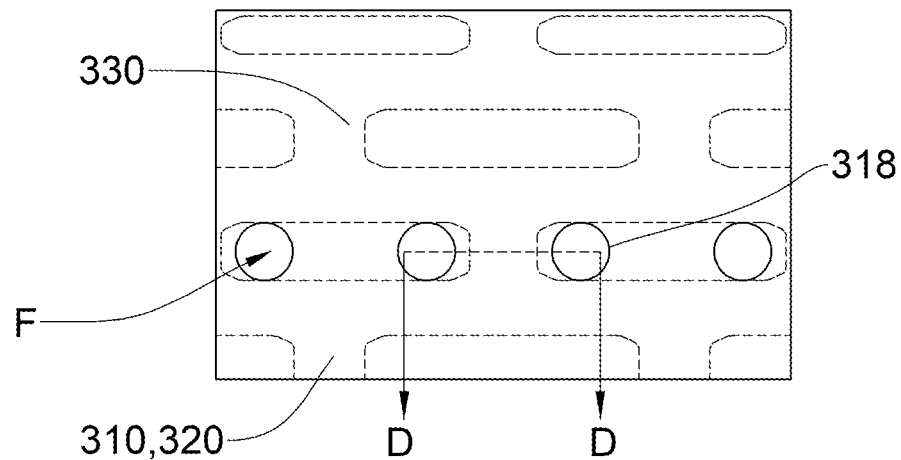
Figure 20B:
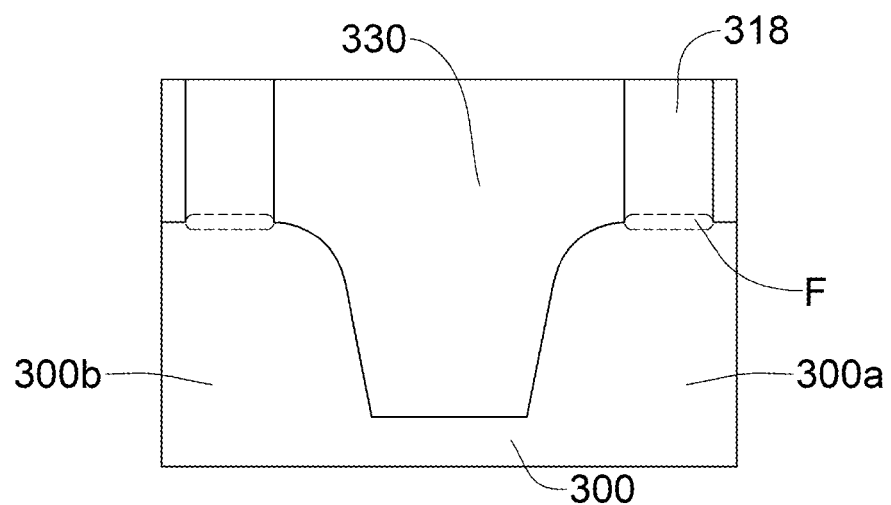
FIG. 20B is a schematic cross-sectional view of the semiconductor substrate structure along the D-D cutting line of FIG. 20A.

Turning to FIG. 20A and FIG. 20B. FIG. 20A is a schematic top view of the present semiconductor substrate structure with contacts landing on the active regions 300a, 30b, and FIG. 20B is a schematic cross sectional view of the present semiconductor substrate structure with contacts landing on the active regions 300a, 300b along the D-D cutting line. An interlay dielectric material 330 is deposited over the semiconductor substrate structure. In an embodied example, the interlay dielectric material 330 may be oxide dielectric, for example silicon dioxide. The silicon dioxide may be provided by CVD method. Then, contact opening is performed to form a plurality of contact openings passing through the interlay dielectric material 330 and landing on the two ends of the active regions 300a, 300b. A contact conductive material is deposited in the contact openings to form contacts 318 landing on the two ends of the active regions 300a, 300b to provide external electrical connection with the source/drain regions occupying at the two ends of the active regions 300a, 300b. The larger contact landing area F at the two ends of the active regions 300a, 300b would provide better process window compared to the prior art semiconductor substrate structure shown in FIG. 9A and FIG. 9B made by the known method. The contact 318 may be landed on the ends of the active regions 300a, 300b with adequate landing area. The contact resistivity can be reduced. A further shrinkage of semiconductor devices is also available by the present invention.

Figure 21A:
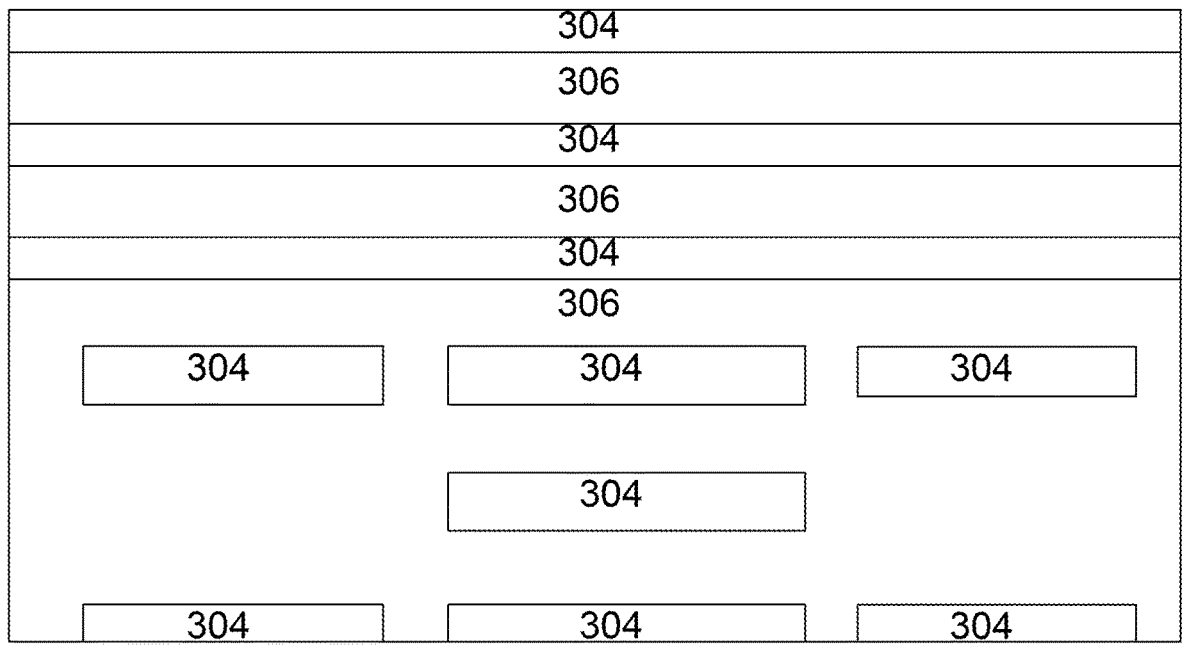
FIG. 21A through FIG. 21C are respective schematic top views of a semiconductor substrate structure at various stages of a method for forming a semiconductor substrate structure in accordance with a second embodiment of the present invention.
Figure 21B:
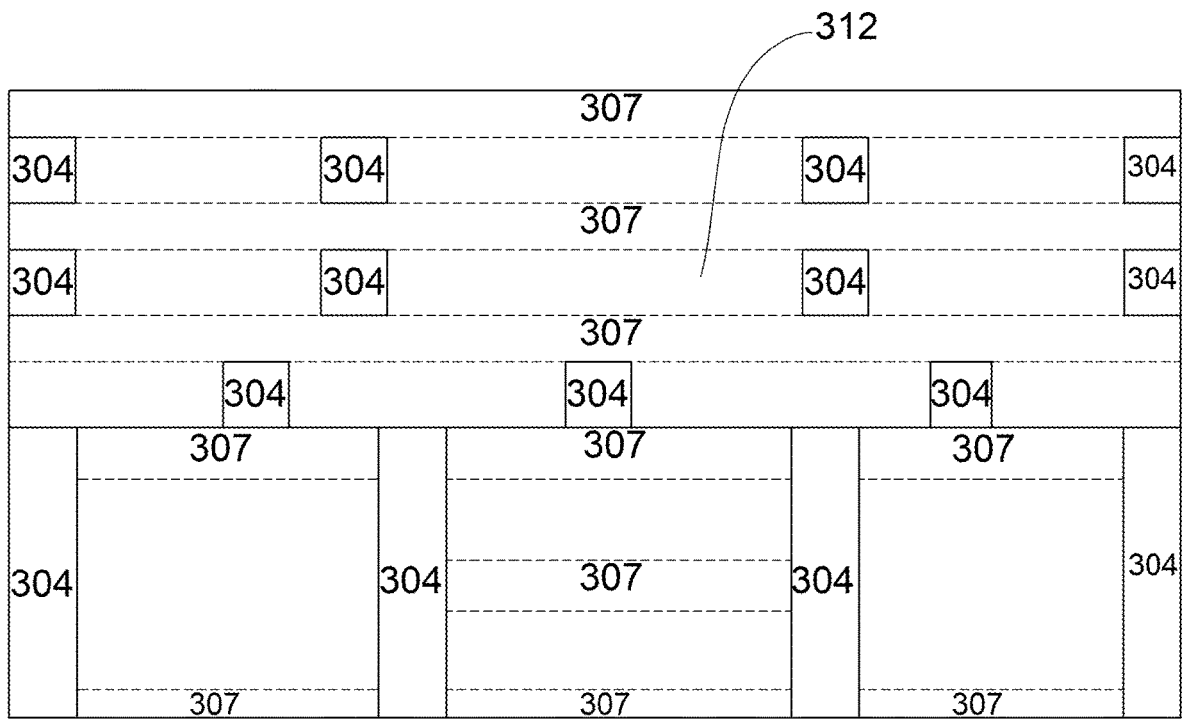

To increase design flexibility of the present shallow trench isolation structure while still enlarging the contact landing area of the active regions compared to the prior art structure shown in FIG. 9A and FIG. 9B, according to a second embodiment, the present invention provides a first pattern composed of a first sub-pattern and a second sub-pattern for forming the first trenches as shown in FIG. 21A. The first sub-pattern is composed of lines aligned in rows along a first dimension and the second sub-pattern contains openings with one or more sizes aligned in rows along the first dimension. The first sub-pattern is formed of line-shaped photoresists 306, and the second sub-pattern is formed of the photoresist layer 306 with openings exposing portions of the silicon nitride layer 304. Except for using a first pattern different from that shown in FIG. 11A through FIG. 11C, rest steps to form the first trenches filled with the first dielectric material are similar to the steps of the first embodiment, and such that a plurality of first trenches 307 filled with the first dielectric material and having one or more sizes along the first dimension are formed. Also, in the second embodiment, the present invention utilizes a second pattern with active-area-defined portions having one or more sizes to define the active regions in the silicon substrate, as shown in FIG. 21B. The second pattern is formed of a patterned photoresist layer 312 with openings having one or more sizes to expose portions of the silicon nitride layer 304, such that the active-area-defined portions are divided by the first trenches 307 filled with the first dielectric material and the openings exposing the portions of the silicon nitride layer 304. The rest steps subsequent to forming the second pattern on the silicon substrate are similar to that of the first embodiment. In accordance with the second embodiment, second trenches filled with a second dielectric material and having one or more sizes are provided, and active regions having one or more sizes are separated from each other by the first trenches filled with the first dielectric material and the second trenches filled with the second dielectric material are obtained.

Figure 21C:
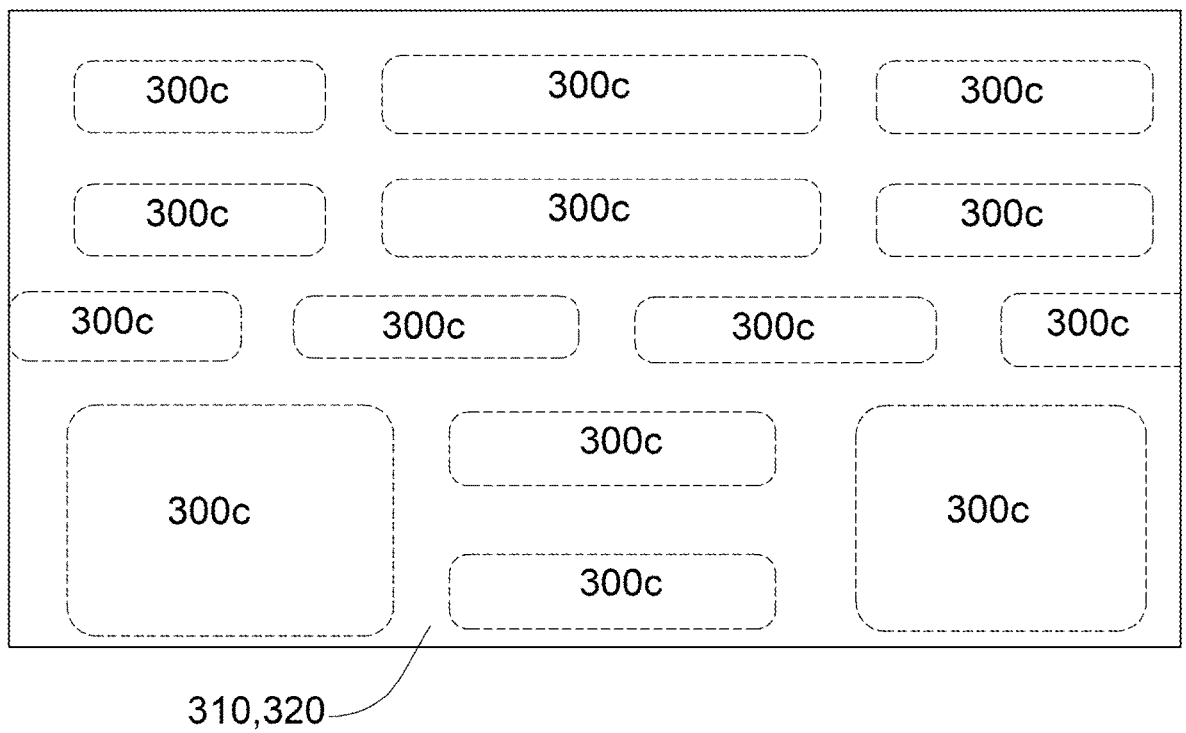

Like the first embodiment, during a second thermal oxidation process to form a second liner oxide on sidewalls and bottoms of the second trenches, the active regions adjoining the second trenches are merely exposed and attacked by the oxygen bearing specie in one direction along the second dimension, while the first trenches 307 filled with the first dielectric material protect the active regions from being exposed and attacked by the oxygen bearing specie in the first dimension. Hence, as shown in FIG. 21C, in accordance with the second embodiment, active regions 300c with one or more sizes and having a rectangular shape with slight round corners may be obtained. One artisan in the field may appreciate a shallow trench isolation structure formed of the first trench having one or more sizes and the second trenches having one or more sizes interdigitated with each other may be obtained in accordance with the present disclosure.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. A method for forming a shallow trench isolation structure with reduced encroachment of active regions of a silicon substrate, comprising:

providing a silicon substrate;

forming a pad oxide layer on an upper surface of the silicon substrate;

forming a silicon nitride layer on the pad oxide layer;

forming a first pattern on the silicon nitride layer, wherein the first pattern is composed of lines aligned in rows along a first dimension, or the first pattern is composed of a first sub-pattern and a second sub-pattern, wherein the first sub-pattern is composed of lines aligned in rows along a first dimension and the second sub-pattern contains openings with one or more sizes aligned in rows along the first dimension;

using the first pattern as a mask and performing a first trench etching process to form a plurality of first trenches along the first dimension, wherein the first trenches have one or more sizes;

removing the first pattern;

performing a first thermal oxidation process to form a first liner oxide on sidewalls and bottoms of the first trenches;

filling the first trenches with a first dielectric material;

forming a second pattern with active-area-defined portions on the silicon substrate, wherein the active-area-defined portions have one or more sizes;

using the second pattern as a mask and performing a second trench etching process to form a plurality of second trenches in a second dimension to define a plurality of the active regions of the silicon substrate, and the active regions are separated from each other by the first trenches filled with the first dielectric material and the second trenches, wherein the active regions has one or more sizes and the second trenches have one or more sizes;

performing a second thermal oxidation process to form a second liner oxide on sidewalls and bottoms of the second trenches; and filing the second trenches with a second dielectric material.

2. The method of claim 1, wherein the step of performing the second trench etching process is to form the second trench with a size different from that of the first trench.

3. The method of claim 1, wherein the step of performing the second trench etching process is to form the second trenches interdigitated with the first trenches to define the active regions for forming memory IC transistors.

4. The method of claim 1, wherein the step of performing the second trench etching process is to form the second trenches interdigitated with the first trenches to define the active regions for forming logic IC transistors.

5. The method of claim 1, wherein the first pattern is formed of a first photoresist layer or a first hard mask.

6. The method of claim 1, wherein the first thermal oxidation process is performed in an oxidation chamber in which the oxidation chamber ambient comprises an oxygen bearing specie.

7. The method of claim 1, wherein the first dielectric material is oxide dielectric.

8. The method of claim 1, further comprising a first CMP process is performed follows the step of filing the first trenches with a first dielectric material.

9. The method of claim 1, wherein the second pattern is formed of a second photoresist layer or a second hard mask.

10. The method of claim 1, wherein the second thermal oxidation process is performed in an oxidation chamber in which the oxidation chamber ambient comprises an oxygen bearing specie.

11. The method of claim 1, wherein the second dielectric material is oxide dielectric.

12. The method of claim 1, further comprising a second CMP process is performed follows the step of filing the second trenches with the second dielectric material.

* * * * *